DEGENERATE SEMICONDUCTOR MEMBER AND DEVICE WITH AT LEAST TWO KINDS OF ACTIVE IMPURITY ATOMS

Filed June 30, 1961

INVENTOR
SAMUEL S. IM
BY Everett A. Gastrell
ATTORNEY

3,267,339
DEGENERATE SEMICONDUCTOR MEMBER AND DEVICE WITH AT LEAST TWO KINDS OF ACTIVE IMPURITY ATOMS

Samuel S. Im, Poughkeepsie, N.Y., assignor to International Business Machines Corporation, New York, N.Y., a corporation of New York Filed June 30, 1961, Ser. No. 121,085
14 Claims. (Cl. 317—234)

The present invention is directed to semiconductor members and devices. More particularly, the invention relates to semiconductor members having particular utility in tunnel diode devices. Accordingly, the invention will be described in that environment.

The tunnel diode, like the conventional semiconductor diode, is a two-terminal semiconductor device comprising a semiconductor body or region of one conductivity type separated from another region of the opposite type by a rectification barrier or junction. Unlike the conventional semiconductor device, the tunnel diode is an abrupt junction device having degenerate doping on both sides of the junction, the doping level being of the order of $10^{19}$ impurity atoms per cubic centimeter or greater. This is about four or five orders of magnitude greater than the doping level found in the usual semiconductor device. As a result, the phenomenon known as tunneling occurs during the operation of the tunnel diode and the latter exhibits a negative resistance region in its current-voltage characteristic when it is forwardly biased. This phenomenon, together with the tunneling characteristic of the diode, avoid the problem or shortcoming of minority carrier drift time which is present in most other semiconductor devices and makes the tunnel diode a fast-operating device which is desirable for many purposes such as high speed switching and the generation of very high frequency oscillations.

A variety of semiconductor materials such as germanium, silicon, silicon carbide, and intermetallic compounds have been employed as the parent bodies or starting wafers in making tunnel diodes. The starting wafer is very often given an N-type conductivity by heavily doping it with an active impurity material, and this may be accomplished by a variety of techniques which are well known in the art. Heavy doping during crystal growth, the quenching of heavily doped solutions, and solid-state diffusion have all been practiced with materials such as germanium. It will be understood that P-type starting wafers may also be employed in tunnel diodes. At present, most tunnel diodes are made using the alloy-junction technique for the production of an abrupt junction. When N-type semiconductor starting wafers of a material such as germanium are being utilized, the junction and its associated P-type recrystallized region are usually made degenerate by the application of acceptor impurities such as gallium, indium, aluminum, boron or other alloys. The material selected for the starting wafer is usually dictated by factors such as cost of the materials, ease of fabrication, and the particular electrical characteristics desired in the tunnel diodes. For example, germanium tunnel diodes ordinarily have higher peak currents and peak-to-valley current ratios than such devices made of silicon which, on the other hand, have greater operating voltage swings. Intermetallic compounds such as gallium arsenide are materials capable of withstanding operation at high temperatures and are usually more costly than germanium or silicon.

N-type germanium starting wafers have proved to be very useful in tunnel diodes. Such wafers are generally highly doped with arsenic to levels which are up to $4\times10^{19}$ atoms per cubic centimeter. While tunnel diodes made from such wafers have characteristics which are desirable for many purposes, they have not proved to be as satisfactory as is desired for some applications demanding stringent or exceptional characteristics. For example, in an operating range of from about 20° C. to 60 or 70° C., the peak current of such a device ordinarily decreases as the operating temperature increases. Furthermore, the peak-to-valley current ratio may not be as great as is needed in conjunction with a peak current characteristic which is relatively insensitive to temperature variations in that range.

It is an object of the present invention, therefore, to provide for use in a tunnel diode device a new and improved semiconductor member which avoids one or more of the above-mentioned disadvantages and limitations of prior such members.

It is another object of the invention to provide a new and improved degeneratively doped semiconductor member.

It is a further object of the invention to provide a new and improved degeneratively doped semiconductor member which is effective to improve the performance of a tunnel diode.

It is also an object of the present invention to provide a new and improved germanium tunnel diode device which has improved electrical characteristics.

It is an additional object of the invention to provide a new and improved germanium tunnel diode device which is relatively insensitive to temperature variations in an operating range in the vicinity of room temperature.

It is yet another object of the invention to provide a new and improved degeneratively doped semiconductor diode which exhibits direct tunnel and phonon-assisted tunneling.

In accordance with a particular form of the invention a semiconductor member comprises a body of semiconductor material which is doped with at least two kinds of active impurity atoms of the same conductivity type in sufficient concentration to render the material degenerate and in such relative proportions that the average size of the impurity atoms approximately matches that of the atoms of the semiconductor material.

The foregoing and other objects, features and advantages of the invention will be apparent from the following more particular description of a preferred embodiment of the invention, as illustrated in the accompanying drawing.

In the drawing:

FIG. 1(*b*) is a sectional view taken on the line 1—1 of FIG. 1;

Figure 1B:
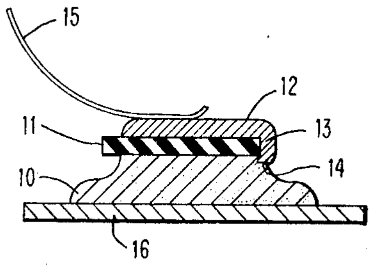
FIG. 1(*a*) is an enlarged plan view of a tunnel diode device which includes a semiconductor member in accordance with the present invention.
Figure 1A:
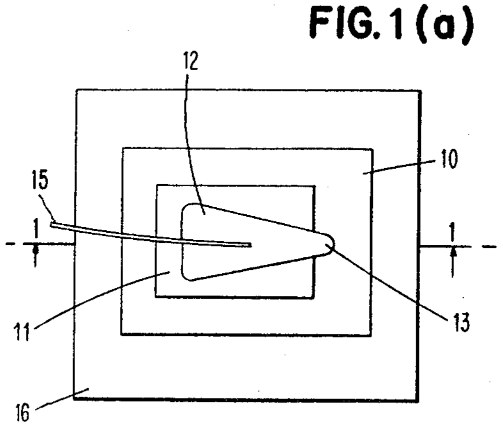

Referring now more particularly to FIGS. 1(*a*) and 1(*b*) of the drawing, the tunnel diode device there represented may be one of the general types disclosed and claimed in the co-pending application of Edward M. Davis, Jr., Serial No. 106,372, filed April 28, 1961, entitled "Semiconductor Device and Method of Making It," and assigned to the same assignee as the present invention. To that end, the device comprises a body or starting wafer 10 of a suitable semiconductor material which is doped with at least two kinds of impurity atoms of the same conductivity type in sufficient concentration to render that material degenerative and in such relative proportions that the average size of those impurity atoms approximately matches that of the atoms of the semiconductor material. The wafer 10 preferably comprises the semiconductor germanium which is degeneratively doped with two donor impurities such as arsenic and antimony in a proportion within the range of 3/1 to 10/1 of arsenic atoms to antimony atoms, respectively, so that their average size approximately matches that of a germanium atom in the starting wafer. More will be said about the starting wafer subsequently.

The tunnel diode also includes an insulating member 11 of a suitable insulating material such as silicon monoxide or quartz which is intimately attached to a portion of one surface of the semiconductor wafer 10. Member 11 may be applied to the upper surface of the wafer by evaporating a film having a thickness of the order of 0.15 mil, the length of approximately 5 mils, and the width of about the same dimensions. Evaporation may be accomplished in a conventional manner by evaporating the silicon monoxide through an apertured molybdenum disk.

The tunnel diode device further includes an electrode 12 which is intimately attached to the upper surface of the insulating member 11 and has an overhanging portion 13 alloyed with the body 10. Electrode 12 is made from at least one active impurity which is capable of creating a very thin PN junction 14. To that end, the electrode may contain up to 2% gallium and the balance indium, the latter impurity also serving as the carrier for the gallium. The high concentration of the active impurities indium and gallium, when alloyed with the germanium wafer 10 in a conventional manner, thins the transition region of the tunnel diode to about 75 angstroms and there is created a P-type region in conjunction with the electrode 12 in a manner well understood in the art. Electrode 12 may be attached to the member 11 by a number of well-known techniques such as sputtering or evaporating through a molybdenum mask, after which the alloying operation is undertaken at a suitable temperature that is effective to form the PN junction 14 between the overhang 13 and the semiconductor wafer 10. A connection in the form of a thin wire 15 has one of its ends attached to the electrode 12 in a suitable manner such as by thermocompression bonding. A conductor in the form of a metallic plate 16 is attached to the lower surface of the semiconductor wafer with an ohmic solder, thus establishing with the wire 15 and the electrode 12 electrical connections to opposite sides of the junction 14.

Figure 2:
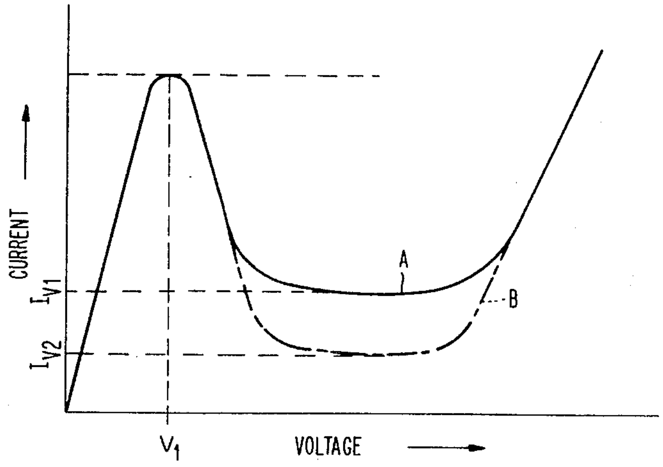
FIG. 2 is a curve employed in explaining an advantage of the device of FIG. 1.

In the manner explained in the above-identified copending application of Edward M. Davis, Jr., an etching operation, which was performed to reduce the size of the PN junction 14 to a value which is effective to establish the desired current-voltage characteristic of the sort represented in FIG. 2, is also effective to remove some of the upper edge portion of the semiconductor wafer so that the insulating member 11 now overhangs a portion of the wafer as represented in FIG. 1(*b*).

Heretofore in the fabrication of N-type germanium material for use in tunnel diodes, the germanium was usually doped with arsenic so that the impurity concentration was up to as high at $4\times10^{19}$ atoms per cubic centimeter. Since the arsenic atoms are smaller than the germanium atoms and go into the germanium lattice substitutionally, that is into normal lattice sites, it is believed that the high doping level will result in a high degree of non-uniform lattice spacings or geometry which contribute to strain in the crystalline structure. This will also occur with a lightly doped germanium material. However, the extent of the strain is much less severe because of the greatly reduced doping level.

It has been determined experimentally that the strain created by heavily doping the germanium wafer of a tunnel diode makes it easier to dislodge carriers when a control voltage is applied to the diode. This effect takes place primarily in the valley region of the current-voltage characteristic of the tunnel diode represented in FIG. 2. It will be noted that this characteristic is generally N-shaped, the current rising steeply to a peak at voltage $V_1$ and then falling abruptly, after which it flattens out into a rather broad valley before rising abruptly again. Curve A of FIG. 2 represents the characteristic of a conventional tunnel diode made in accordance with the prior art wherein but one active impurity such as arsenic is employed in highly doped germanium. Curve B, the valley region of which is represented in dash-dot construction but otherwise conforms to Curve A, is the characteristic curve for a tunnel diode made in accordance with the present invention wherein the germanium wafer contains the impurity elements arsenic and antimony in such relative proportions that their average size approximately matches that of the germanium atoms. It will be seen that the valley current $I_{V1}$ of curve A is greater than the corresponding current $I_{V2}$ of curve B. For some applications the larger valley current of curve A is desirable, and this excess valley current is believed to be caused by the strain in the single-doped germanium which promotes the dislodging of the carriers from the lattice structure of that wafer. When the strain is reduced in the wafer by having proper proportions of at least two active impurity elements, the low valley current $I_{V2}$ of curve B may be obtained, thus desirably increasing the peak-to-valley current ratio. Peak-to-valley ratios averaging 12/1 have been obtained with tunnel diodes having germanium crystals containing the two impurities just mentioned.

The mismatch in the sizes of the germanium and arsenic atoms may be offset by substituting antimony atoms for some of the arsenic atoms. To that end the relation:

$$r_{Ge}=\frac{N_{As}\times1.18+N_{Sb}\times1.36}{N_{As}+N_{Sb}} \qquad (1)$$

where $r_{Ge}$ is the radius of a germanium atom in angstroms
1.18 is the radius of an arsenic atom in angstroms
1.36 is the radius of an antimony atom in angstroms
$N_{As}$ is the number of arsenic atoms
$N_{Sb}$ is the number of antimony atoms.

is useful. Substituting 1.22 for the radius of a germanium atoms in the foregoing expression, we may then obtain the ratio $$\frac{N_{As}}{N_{Sb}}=\frac{3.5}{1} \qquad (2)$$

Thus by controlling the relative concentrations of arsenic and antimony atoms in the germanium wafer in accordance with the ratio 3.5/1, we are able substantially to match the average size of the two impurity atoms with that of the germanium atom. For some applications it may not be necessary to control the ratio that accurately. A range of ratios from 10/1 to 3/1 may prove to be adequate for those applications, thus providing an approximate match of the average size of the impurity atoms with that of the germanium atoms.

Various ways in which the doping of the semiconductor wafer may be accomplished will suggest themselves to one skilled in the semiconductor art. For example, the wafers may be cut from a semiconductor bar which previously had been doped to a desirable level with antimony and processed by the zone-leveling technique. Thereafter the wafer might be lapped, polished if needed, and then diffused in a conventional manner with arsenic for a sufficient time to provide a desired uniformly-distributed, degeneratively-doped wafer. For example, if it is desired that the germanium wafers be doped with antimony, such that the concentration of antimony atoms is within the range of $4\times10^{18}$ to $1.4\times10^{19}$ atoms per cubic centimeter, then the diffusion with arsenic may be selected to afford an arsenic concentration which is a predetermined number of times that of the antimony. It will be understood that the higher doping levels in tunnel diodes are employed to meet fast speed requirements.

Figure 3:
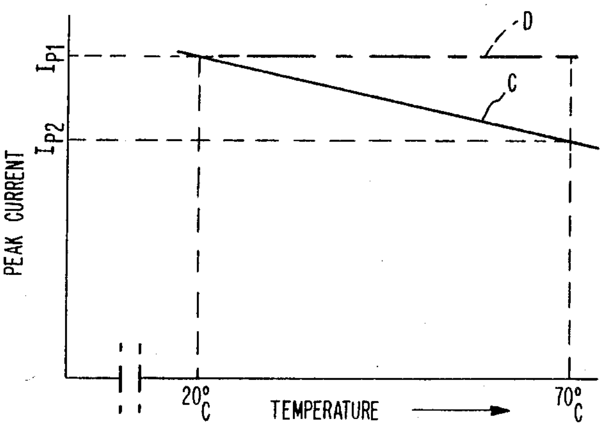
FIG. 3 is another curve which is used in explaining another advantage of that device.

In general, there are two kinds of tunneling mechanisms: (1) direct tunneling and (2) phonon assisted tunneling. It so happens that heavily doping a germanium wafer with arsenic promotes direct tunneling while the doping with antimony promotes phonon assisted tunneling. The use of the two impurities just mentioned in a degeneratively doped germanium wafer provides an additional advantage over one which is degeneratively doped with a single impurity. In the direct tunneling phenomenon in a tunnel diode, the peak current decreases as the temperature rises in an operating range which is near room temperature. Such a decrease is represented by curve C of FIG. 3 over the temperature range of from 20° C. to 70° C. wherein the peak current decreases from a value $I_{P1}$ at 20° C. to the value of $I_{P2}$ at 70° C. This decrease may be about 10 to 14% of the value of the peak current at 20° C. The impurity antimony promotes phonon assisted tunneling and may be employed in a degeneratively doped wafer in conjuction with arsenic to maintain the peak current of a tunnel diode substantially constant, as represented by the dash-dot line curve D, over a desired range of temperature such as between 20° C. and 70° C. Thus a proper selection of the two doping agents may be utilized to provide a peak current-temperature curve having a desired slope or absence thereof. Small positive slopes may also be realized by a suitable proportioning of the two doping agents.

While the invention has been particularly shown and described with reference to a preferred embodiment thereof, it will be understood by those skilled in the art that various changes in form and details may be made therein without departing from the spirit and scope of the invention.

What is claimed is:

1. A semiconductor member comprising: a body of semiconductor material which is doped with at least two kinds of active impurity atoms of the same conductivity type in sufficient concentration to render said material degenerate and in such relative proportions that the average size of said impurity atoms approximately matches that of the atoms of said semiconductor material.

2. A semiconductor member comprising: a body of semiconductor material which is doped with at least two kinds of active impurity atoms of the same conductivity type in sufficient concentration to render said material degenerate and in such relative proportions that the average size of said impurity atoms substantially matches that of the atoms of said semiconductor material.

3. A semiconductor member comprising: a body of semiconductor material which is doped with two kinds of active impurity atoms of the same conductivity type in sufficient concentration to render said material degenerate and in such relative proportions that the average size of said impurity atoms approximately matches that of the atoms of said semiconductor material.

4. A semiconductor member comprising: a body of semiconductor material which is doped with at least two kinds of donor impurity atoms in sufficient concentration to render said material degenerate and is such relative proportions that that average size of said impurity atoms approximately matches that of the atoms of said semiconductor material.

5. A semiconductor member comprising: a body of semiconductor material which is doped with arsenic and antimony impurity atoms in sufficient concentration to render said material degenerate and in such relative proportions that the average size of said impurity atoms approximately matches that of the atoms of said semiconductor material.

6. A semiconductor member comprising: a body of germanium semiconductor material which is doped with arsenic and antimony impurity atoms in a concentration of the order of $10^{19}$ atoms per cubic centimeter to render said material degenerate and a proportion within the range of 3/1 to 10/1 of arsenic atoms to antimony atoms so that the average size of said impurity atoms approximately matches that of the atoms of said semiconductor material.

7. A semiconductor member comprising: a body of germanium semiconductor material which is doped with arsenic and antimony impurity atoms in a concentration of at least $10^{19}$ atoms per cubic centimeter to render said material degenerate and in the proportion of about 3.5 arsenic atoms to 1 antimony atom so that the average size of said impurity atoms substantially matches that of the atoms of said semiconductor material.

8. A semiconductor device comprising: a body of semiconductor material which is doped with at least two kinds of active impurity atoms of the same conductivity type in sufficient concentration to render said material degenerate and in such relative proportions that the average size of said impurity atoms approximately matches that of the atoms of said semiconductor material; and electric connecting means in contact with said body.

9. A semiconductor device comprising: a body of semiconductor material which is doped with at least two kinds of active impurity atoms of the same conductivity type in sufficient concentration to render said material degenerate and in such relative proportions that the average size of said impurity atoms approximately matches that of the atoms of said semiconductor material; a PN junction in said body; and electrical connections to opposite sides of said junction.

10. A semiconductor device comprising: a body of semiconductor material which is doped with a least two kinds of active impurity atoms of the same conductivity type in sufficient concentration to render said material degenerate and in such relative proportions that the average size of said impurity atoms approximately matches that of the atoms of said semiconductor material; an electrode alloyed to said body and forming a PN junction; and electrical connections to opposite sides of said junction.

11. A semiconductor device comprising: a body of semiconductor material which is doped with a least two kinds of donor impurity atoms in sufficient concentration to render said material degenerate and in such relative proportions that the average size of said impurity atoms approximately matches that of the atoms of said semiconductor material; an electrode alloyed to said body from a mass containing at least 98% indium and the balance gallium and forming a PN junction; and electrical connections to opposite sides of said junction.

12. A semiconductor device comprising: a body of semiconductor material which is doped with arsenic and antimony impurity atoms in sufficient concentration to render said material degenerate and in such relative proportions that the average size of said impurity atoms approximately matches that of the atoms of said semiconductor material; an electric alloyed to said body from a mass containing at least 98% indium and the balance gallium and forming a PN junction; and electrical connections to opposite sides of said junction.

13. A semiconductor device comprising: a body of germanium semiconductor material which is doped with arsenic and antimony impurity atoms in a concentration in the range of $10^{19}$ to $4 \times 10^{19}$ atoms per cubic centimeter to render said material degenerate and in a proportion within the range of 3/1 to 10/1 of arsenic atoms so that the average size of said impurity atoms approximately matches that of the atoms of said semiconductor material; an electrode alloyed to said body from a mass containing at least 98% indium and the balance gallium and forming a PN junction; and electrical connections to the opposite sides of said junction.

14. A semiconductor device comprising: a body of germanium semiconductor material which is doped with arsenic and antimony impurity atoms in sufficient concentration to render said material degenerate and in a proportion of about 3 arsenic atoms to 1 antimony atom so that the average size of said impurity atoms approximately matches that of the atoms of said semiconductor material; an electrode alloyed to said body from a mass containing at least 98% indium and the balance gallium and forming a PN junction; and electrical connections to opposite sides of said junction.

References Cited by the Examiner

Long: "On the Nature of the Maximum and Minimum Tunnel Diodes" (Sylvania Electric Products, Inc.), Bull. Am. Phys. Soc., Ser. II, vol. 5, page 160A, March 4, 1960, Abstract.

JOHN W. HUCKERT, *Primary Examiner.*

GEORGE N. WESTBY, A. S. KATZ, R. SANDLER, *Assistant Examiners.*

UNITED STATES PATENT OFFICE

CERTIFICATE OF CORRECTION

Patent No. 3,267,339 August 16, 1966

Samuel S. Im

It is hereby certified that error appears in the above numbered patent requiring correction and that the said Letters Patent should read as corrected below.

Column 3, line 22, for "disk" read -- mask --; column 4, line 21, for "desirable" read -- undesirable --; column 6, line 67, after "atoms" insert -- to antimony atoms --.

Signed and sealed this 1st day of August 1967.

(SEAL)
Attest:

Edward M. Fletcher, Jr.
Attesting Officer

EDWARD J. BRENNER
Commissioner of Patents